United States Patent
Li et al.

(10) Patent No.: US 7,256,426 B2
(45) Date of Patent: Aug. 14, 2007

(54) RARE EARTH ELEMENT-DOPED SILICON/SILICON DIOXIDE LATTICE STRUCTURE

(75) Inventors: Tingkai Li, Vancouver, WA (US); Wei Gao, Vancouver, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 238 days.

(21) Appl. No.: 11/039,463

(22) Filed: Jan. 19, 2005

(65) Prior Publication Data

US 2006/0160335 A1 Jul. 20, 2006

(51) Int. Cl.
H01L 27/15 (2006.01)
H01L 21/00 (2006.01)

(52) U.S. Cl. ............... 257/80; 257/103; 257/222; 438/22; 438/29; 438/30; 438/45

(58) Field of Classification Search .......... 438/22, 438/29, 45, 30; 257/102, 103, 222, 225, 257/80, 101
See application file for complete search history.

(56) References Cited

U.S. PATENT DOCUMENTS

2004/0183087 A1* 9/2004 Gardner ............ 257/102

OTHER PUBLICATIONS

Pavesi L etc. "Optical gain in silicon nanocrystals" Nature, 440-444, 2003. Keisuke Sato etc. "Nucleation and growth of nanocrystalline silicon studied by TEM, XPS and ESR." Applied surface science, 216 (1-4), 376-381, 2003.
Keisuke Sato etc. "Multi-color luminescence from surface oxidized silicon nanoparticles." MRS Fall meeting, 2003.
Maria E. Castagna etc. "High efficiency light emission devices in silicon." MRS spring meeting, 2003.
Pasquarello A etc. "Si 2p Core-level Shifts at the Si(001)-SiO2 Interface: A first-Principles Study" Phys. Rev. Lett. 74, No. 6 1024 (1995).
Minoru Fujii etc. "Improvement in photoluminescence efficiency of $SiO_2$ films containing Si nanocrystals by P doping: An electron spin resonance study" J, Appl. Phys. 87. No. 4 1855 (2000).

* cited by examiner

Primary Examiner—Hsien-Ming Lee
(74) Attorney, Agent, or Firm—Law Office of Gerald Maliszewski; Gerald Maliszewski

(57) ABSTRACT

Provided are an electroluminescence (EL) device and corresponding method for forming a rare earth element-doped silicon (Si)/Si dioxide (SiO2) lattice structure. The method comprises: providing a substrate; DC sputtering a layer of amorphous Si overlying the substrate; DC sputtering a rare earth element; in response, doping the Si layer with the rare earth element; DC sputtering a layer of SiO2 overlying the rare earth-doped Si; forming a lattice structure; annealing; and, in response to the annealing, forming nanocrystals in the rare-earth doped Si having a grain size in the range of 1 to 5 nanometers (nm). In one aspect, the rare earth element and Si are co-DC sputtered. Typically, the steps of DC sputtering Si, DC sputtering the rare earth element, and DC sputtering the SiO2 are repeated 5 to 60 cycles, so that the lattice structure includes the plurality (5-60) of alternating SiO2 and rare earth element-doped Si layers.

33 Claims, 5 Drawing Sheets

RARE EARTH ELEMENT-DOPED SILICON/SILICON DIOXIDE LATTICE STRUCTURE

BACKGROUND OF THE INVENTION

1. Field of the Invention

This invention generally relates to integrated circuit (IC) fabrication and, more particularly, to a rare earth element-doped silicon/silicon dioxide lattice structure, and an associated fabrication process, that can be used in electroluminescence (EL) devices.

2. Description of the Related Art

The observation of visible luminescence at room temperature, emanating from porous silicon (Si), has spurred a tremendous amount of research into using nano-sized Si to develop a Si-based light source. One widely used method of fabricating nanocluster Si (nc-Si) is to precipitate the nc-Si out of SiOx (x<2), producing a film using chemical vapor deposition (CVD), radio frequency (RF)-sputtering, and Si implantation, which is often called silicon-rich silicon oxide (SRSO). Er implantation, creating Er-doped nanocrystal Si, is also used in Si based light sources. However, state-of-the-art implantation processes have not been able to distribute the dopant uniformly, which lowers the light emitting efficiency and increases costs. At the same time, there has been no interface engineering sufficient to support the use of such a dopant. The device efficiency is very low and the process temperature is very high, which limits the device applications. In order to improve the device efficiency, a large interface area must be created between nanocrystal Si and $SiO_2$.

Silicon has conventionally been considered unsuitable for optoelectronic applications, due to the indirect nature of its energy band gap. Bulk silicon is indeed a highly inefficient light emitter. Among the different approaches developed to overcome this problem, quantum confinement in Si nano-structures and rare earth doping of crystalline silicon have received a great deal of attention. In particular, Si nanoclusters (NC) embedded in $SiO_2$ have in recent years attracted the interest of the scientific community as a promising new material for the fabrication of a visible Si-based light source. Alternatively, Er-doped crystalline Si has been extensively studied to take advantage of the radiative intra-4f shell Er transition. Room temperature operating devices with efficiencies of around 0.05% have been achieved. However as mentioned above, the device efficiency is very low and the process temperature is very high, normally over 1100° C.

Recently, Dr. Pasquarello proposed a theory for photoemission of Si—$SiO_2$ interface. Based on the theory, Si 2p core-level shifts at the Si(001)-$SiO_2$ interface depend linearly on nearest-neighbor oxygen atoms. Second nearest-neighbor effects turn out to be negligibly small. Therefore, the photoemission spectra require that all Si in the oxidation state be present at the interface. That is, the making of a large area of Si—$SiO_2$ interface is a critical issue for EL device applications.

It would be advantageous if a rare earth doped-Si EL device could be made efficiently, at low process temperatures.

It would be advantageous if a rare earth element could be more efficiently distributed in a Si film, to enhance the formation of nanocrystals.

SUMMARY OF THE INVENTION

Generally, the present invention relates to processes and the fabrication of EL and light emitting diode (LED) devices. Furthermore, the invention deals with a method to make nanocrystalline Si with a rare earth element dopant, formed in a multi-layer or superlattice structure with SiO2, for EL and LED device applications. These processes use DC sputtering with either a thermal annealing process, or a process that includes both plasma oxidation and thermal annealing steps. Rare earth doping is performed by co-sputtering, eliminating the ion implantation process. The co-sputtering process lowers expenses and permits improved control over doping density and the doping profile in the film structure. Using these processes, the process temperature can be made low enough to support the fabrication of EL and LED devices on glass (temperature-sensitive) substrates.

Accordingly, a method is provided for forming a rare earth element-doped silicon (Si)/Si dioxide (SiO2) lattice structure. The method comprises: providing a substrate; DC sputtering a layer of amorphous Si overlying the substrate; DC sputtering a rare earth element; in response to the DC sputtering, doping the Si layer with the rare earth element; DC sputtering a layer of SiO2 overlying the rare earth-doped Si; forming a lattice structure; annealing; and, in response to the annealing, forming nanocrystals in the rare-earth doped Si having a grain size in the range of 1 to 5 nanometers (nm). In one aspect, the rare earth element and Si are co-DC sputtered.

Typically, the steps of DC sputtering Si, DC sputtering the rare earth element, and DC sputtering the SiO2 are repeated 5 to 60 cycles, so that the lattice structure includes the plurality (5-60) of alternating SiO2 and rare earth element-doped Si layers. The Si is DC-sputtered to deposit a Si layer having a thickness in the range of 1 to 5 nm. The SiO2 is DC-sputtering to deposit a layer of SiO2 having a thickness in the range of 2 to 3 nm. The annealing is carried out at a temperature in the range between 850 and 1250 degrees C., for a time in the range of 10 to 60 minutes, in an atmosphere void of oxygen and with a gas such as Ar or N2. The rare earth element can be erbium (Er), ytterbium (Yb), cerium (Ce), praseodymium (Pr), or terbium (Tb).

In other aspects, the substrate acts as a bottom electrode, or a bottom electrode is formed between the substrate and the lattice structure. Then, the method further comprises: forming a top electrode overlying the lattice structure. In this manner, an EL device is fabricated.

Additional details of the above-described method, a corresponding lattice structure, and an EL device are described below.

DETAILED DESCRIPTION

Figure 1:
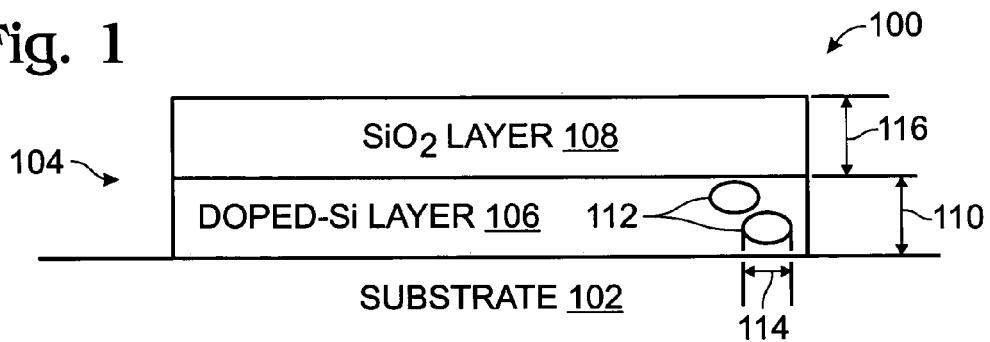
FIG. 1 is a partial cross-sectional view of a rare earth element-doped silicon (Si)/Si dioxide (SiO2) lattice structure.

FIG. 1 is a partial cross-sectional view of a rare earth element-doped silicon (Si)/Si dioxide (SiO2) lattice structure. The structure 100 comprises a substrate 102 and a lattice structure 104 overlying the substrate 102. The substrate 102 can be a material such as Si, N type Si, P type Si, Si glass, gallium arsenic (GaAs), silicon carbide (SiC), gallium nitride (GaN), or Al2O3 (sapphire). The lattice structure 104 includes a rare earth element-doped Si layer 106 and a SiO2 layer 108. Note, although the doped-Si layer 106 is shown interposed between the substrate 102 the SiO2 layer 108, the order of the layers may be reversed so that the SiO2 layer 108 directly overlies the substrate 102.

Figure 2:
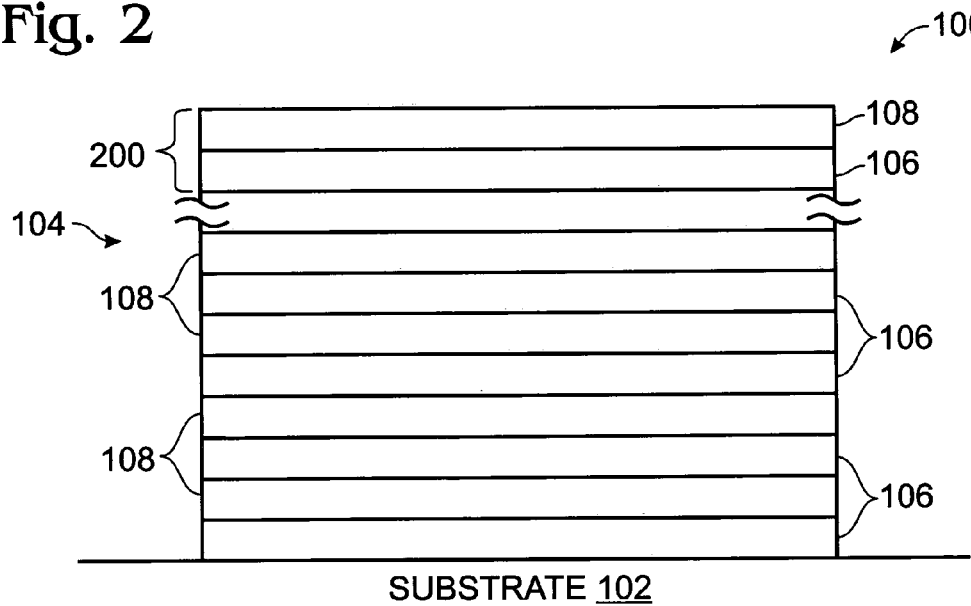
FIG. 2 is a partial cross-sectional showing a first variation of the lattice structure of FIG. 1.

FIG. 2 is a partial cross-sectional showing a first variation of the lattice structure of FIG. 1. Although FIG. 1 shows a lattice structure with only 1 set of alternating layers, typically the lattice structure 104 is made up of a number of alternating layer sets 200, where each set 200 includes a rare earth element-doped Si layer 106 and a SiO2 layer 108. In one aspect, the number of sets 200 is in the range between 5 and 60.

Returning to FIG. 1, the rare earth element-doped Si layer 106 has a thickness 110 in the range of 1 to 5 nanometers (nm). The rare earth element-doped Si layer 106 includes Si nanocrystals, such as nanocrystals 112, having a grain size 114 in the range of 1 to 5 nm. The SiO2 layer 108 has a thickness 116 in the range of 2 to 3 nm. The rare earth element used in doping the doped Si layer 106 may be erbium (Er), ytterbium (Yb), cerium (Ce), praseodymium (Pr), or terbium (Tb). However, the invention may also be practiced using other elements located in close proximity to the listed elements in the Periodic Table, and known to have similar characteristics.

Figure 3:
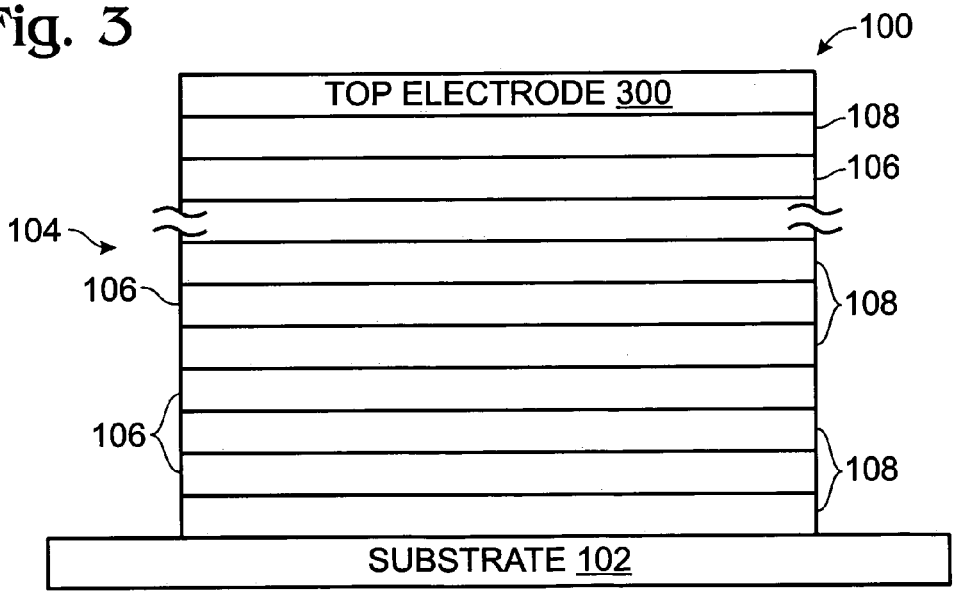
FIG. 3 is a partial cross-sectional view of a variation of the lattice structure of FIG. 1, showing an electroluminescence (EL) device.

FIG. 3 is a partial cross-sectional view of a variation of the lattice structure of FIG. 1, showing an electroluminescence (EL) device. Here, the substrate 102 is a substrate bottom electrode, and the structure 100 further comprises a top electrode 300 overlying the lattice structure 104. The top electrode 300 can be a material such as polycrystalline Si, indium tin oxide (ITO), gold (Au), aluminum (Al), zinc oxide (ZnO), or chromium (Cr), to name a few examples. Other electrode materials are also well known in the art. As shown, an initial layer 108 of SiO2 directly overlies the bottom electrode substrate 102. That is, a SiO2 layer 108 directly adjoins both the top electrode 300 and the bottom electrode 102. Such an arrangement is useful if a tunneling device is to formed. However, for other applications the placement of SiO2 layers directly adjacent either, or both electrodes is not necessarily critical.

Figure 4:
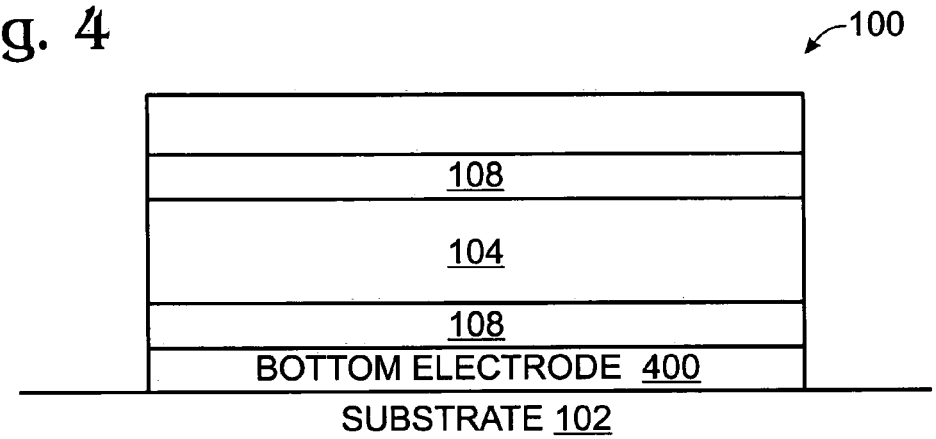
FIG. 4 is a partial cross-sectional view of a variation of the EL device shown in FIG. 3.

FIG. 4 is a partial cross-sectional view of a variation of the EL device shown in FIG. 3. The substrate 102 is a temperature-sensitive material such as glass, plastic, or quartz. Such a material may be used in the fabrication of a display, for example. The structure 100 further comprises a bottom electrode 400 interposed between the substrate 102 and the lattice structure 104. A top electrode 200 overlies the lattice structure 104. As shown, a SiO2 layer 108 could be formed directly overlying the bottom electrode 400, if a tunneling device is desired. Alternately but not shown, the SiO2 layers need not necessarily be situated directly adjacent either, or both of the electrodes.

FUNCTIONAL DESCRIPTION

Figure 5:
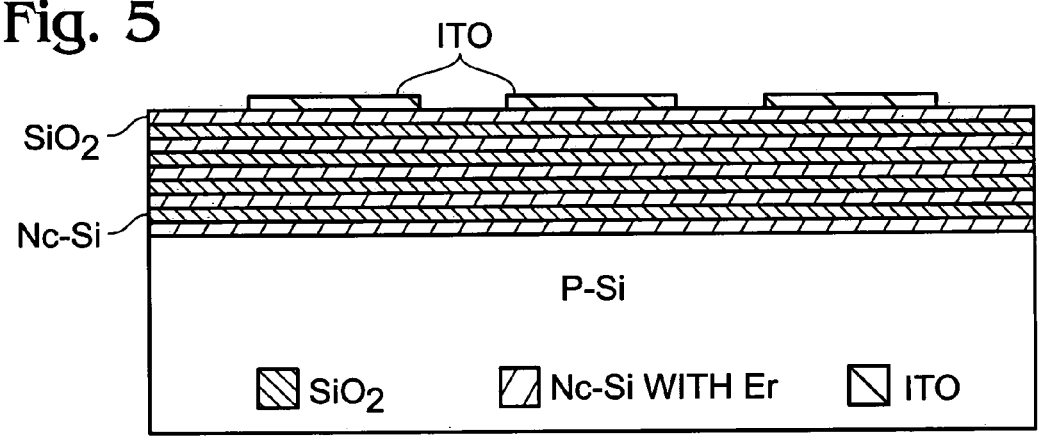
FIG. 5 shows another view of an EL device structure, similar to the structure of FIG. 3.

FIG. 5 shows another view of an EL device structure, similar to the structure of FIG. 3. The invention makes use of nanocrystal Si (Nc-Si) with rare earth dopant/$SiO_2$ multilayer and superlattice structures for EL and LED device applications. To illustrate the invention, the rare earth element Er will be used as an example. As described below, the fabrication process uses co-DC sputtering, and thermal annealing or plasma oxidation processes. The DC sputtering process is used to deposit a very thin amorphous silicon layer, from 1-5 nm thick. Then, the power levels and oxygen partial pressure is adjusted to deposit a silicon dioxide layer, from 1 to 5 nm thick. The DC sputtering processes are repeated, forming a superlattice structure of Si—$SiO_2$. During the deposition of the Si layer, a rare earth element such as Er, can be co-sputtered to form a Er-doped Si layer. The DC-sputtering processes for Si, $SiO_2$, and Er materials are shown in Tables 1, 2, and 3.

TABLE 1

The DC sputtering process conditions for silicon deposition

| Target | Power (W) | Deposition temp. | Deposition pressure | Atmosphere | Deposition time |
|---|---|---|---|---|---|
| N, or P type Si | 100-300 | 20-300° C. | 2-10 mTorr | Ar or N2 | 0.1-5 min. for each layer |

TABLE 2

The DC sputtering process conditions for Er deposition

| Target | Power (w) | Deposition temp. | Deposition pressure | Atmosphere | Deposition time |
|---|---|---|---|---|---|
| Er | 50-300 | 20-300° C. | 2-10 mTorr | Ar or N2 | 0.1-5 min. for each layer |

TABLE 3

The DC sputtering process conditions for silicon dioxide deposition

| Target | Power (w) | Deposition temp. | Deposition pressure | Atmosphere | Deposition time |
|---|---|---|---|---|---|
| N, or P type Si | 100-300 | 20-300° C. | 2-10 mTorr | Ar or N2 with 2-30% $O_2$ | 0.1-5 min. for each layer |

Figure 6:
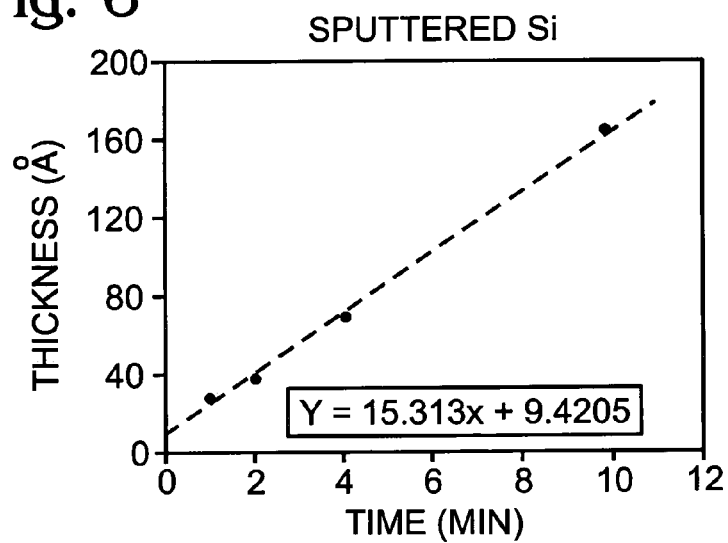
FIG. 6 is a graph depicting the relationship between the thickness of the Si layer and deposition time.

FIG. 6 is a graph depicting the relationship between the thickness of the Si layer and deposition time. The deposition conditions for forming Si layers are as follows: Power: 150 W, Deposition Temperature: 250° C., Deposition Pressure:

7.5 mTorr, and atmosphere: Ar. A Si layer with a thickness of 2-3 nm can be obtained with a deposition time of around 1 minute.

Figure 7:
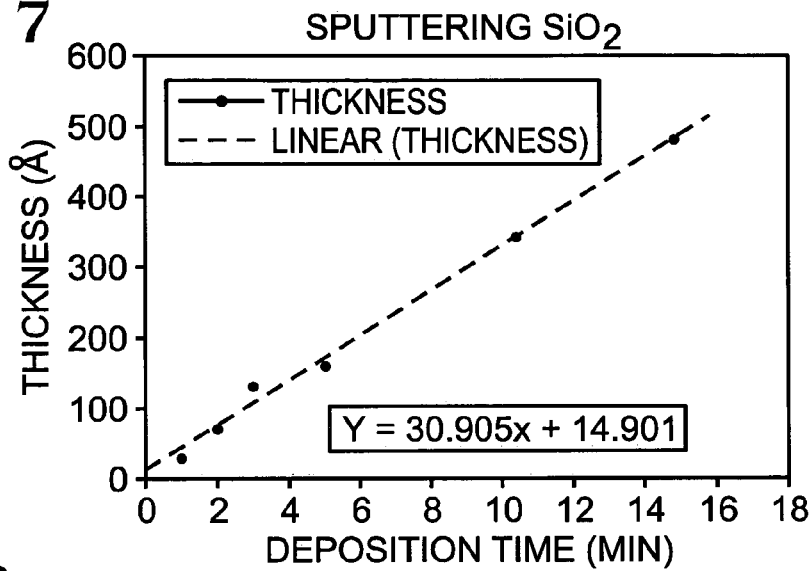
FIG. 7 is a graph depicting the relationship between the thickness of the $SiO_2$ layer and deposition time.

FIG. 7 is a graph depicting the relationship between the thickness of the $SiO_2$ layer and deposition time. The deposition conditions for $SiO_2$ layers are as follows: Power: 150 W, Deposition Temperature: 250° C., Deposition Pressure: 7.5 mTorr, and atmosphere: 15% $O_2$/Ar (15% oxygen with Ar). A $SiO_2$ layer with a thickness of 2-3 nm can be made with a deposition time of around 1 minute.

Figure 8:
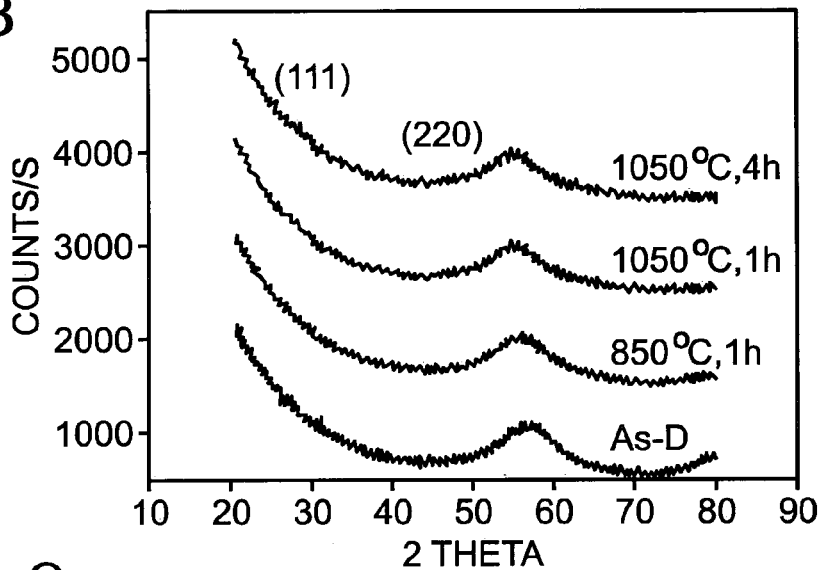
FIG. 8 is a graph depicting the x-ray patterns of superlattice Si—$SiO_2$ structures at various thermal annealing temperatures.

FIG. 8 is a graph depicting the x-ray patterns of superlattice Si—$SiO_2$ structures at various thermal annealing temperatures. As-deposited silicon is amorphous, and forms nanocrystal polysilicon after thermal annealing processes. Based upon the x-ray calculation, the grain size of polysilicon increases from a few nm, to 5 nm, in response to increasing the thermal oxidation temperature from 850° C., to 1050° C.

Figure 9:
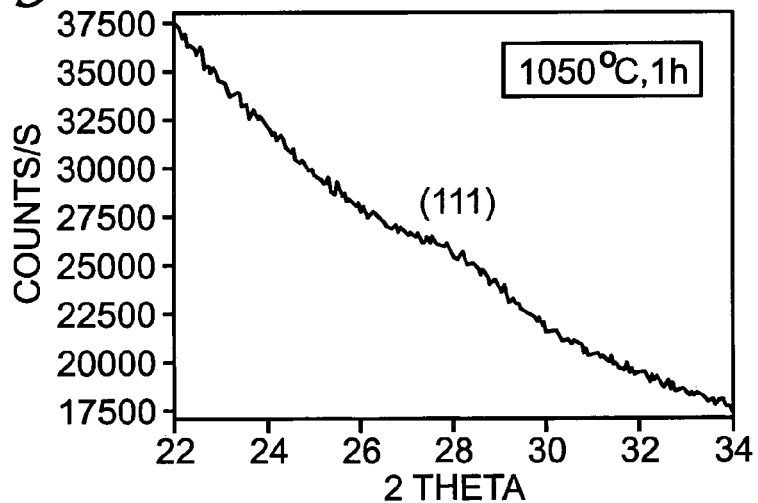
FIG. 9 is a graph depicting the x-ray pattern of a 20-layer superlattice Si—$SiO_2$ structure, thermally annealed at 1050° C. for 1 hour.

FIG. 9 is a graph depicting the x-ray pattern of a 20-layer superlattice Si—$SiO_2$ structure, thermally annealed at 1050° C. for 1 hour. The grain size of the nanocrystal Si is about 4-5 nm based on the x-ray data calculation. Experimental results also show that the grain sizes of nanocrystal Si layer are controlled by the thermal annealing temperature, annealing time, and thickness of each Si layer. For a given annealing condition, thinner polysilicon layers result in smaller Si nanocrystal sizes. For a given thickness of polysilicon, a lower temperature and the shorter annealing time result is smaller Si nanocrystalline sizes.

The photoluminescence efficiency of $SiO_2$ films containing Si nanocrystals can be improved by P doping the $SiO_2$ layers. Therefore, nanocrystal Si/P-doped $SiO_2$ multi-layers and superlattice structures, formed through DC sputtering, result in brighter and more efficient Si-based EL and LED devices.

Figure 10:
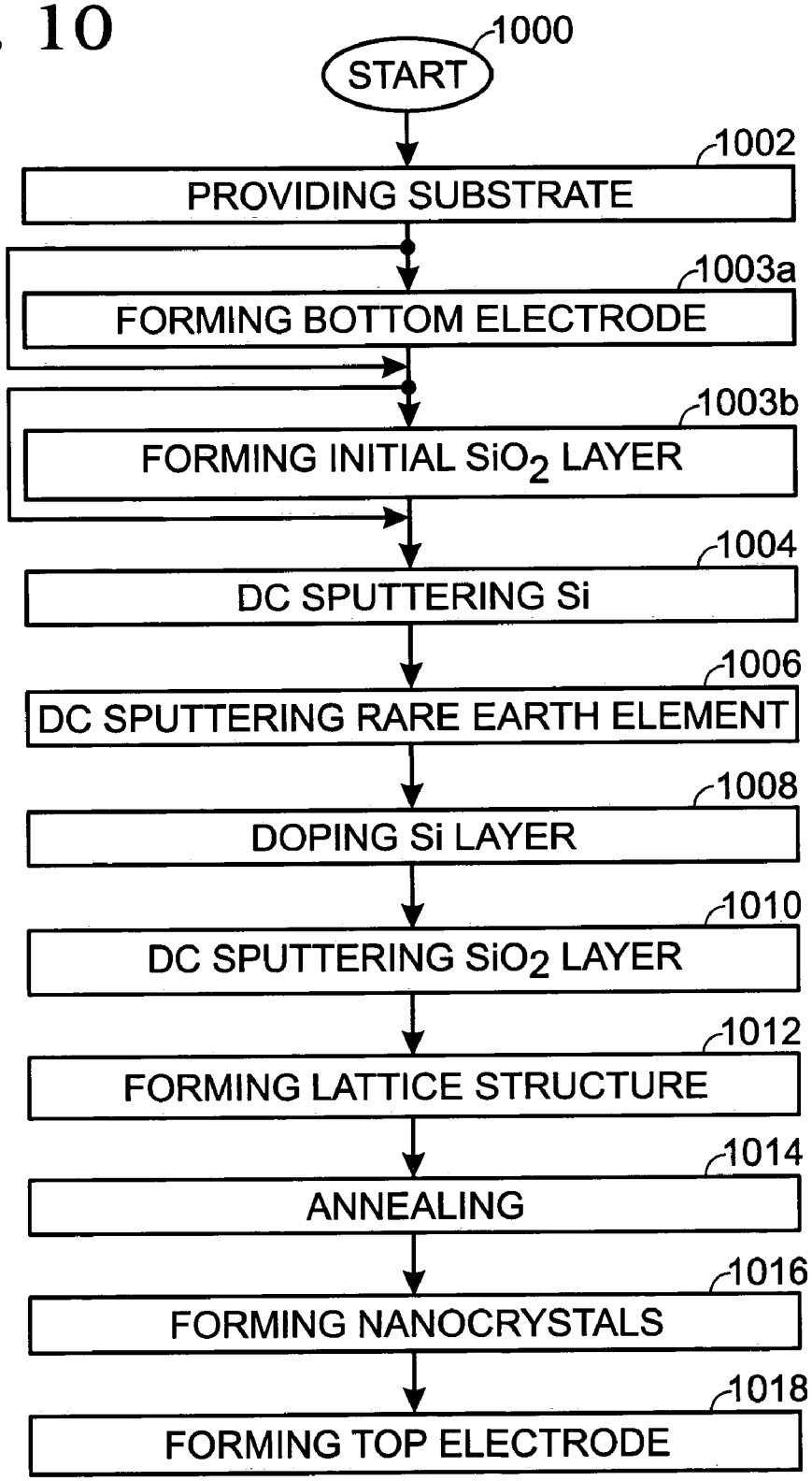
FIG. 10 is a flowchart illustrating a method for forming a rare earth element-doped Si/SiO2 lattice structure.

FIG. 10 is a flowchart illustrating a method for forming a rare earth element-doped Si/SiO2 lattice structure. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1000.

Step 1002 provides a substrate. For example, the substrate material can be Si, N type Si, P type Si, Si glass, gallium arsenic (GaAs), silicon carbide (SiC), gallium nitride (GaN), or Al2O3 (sapphire). Step 1004 DC sputters a layer of amorphous Si overlying the substrate. Step 1006 DC sputters a rare earth element. In one aspect, the rare earth element and Si are co-DC sputtered. That is, Steps 1004 and 1006 are performed simultaneously. Step 1008 dopes the Si layer with the rare earth element in response to the DC sputtering. Step 1010 DC sputters a layer of SiO2 overlying the rare earth-doped Si. Step 1012 forms a lattice structure. Step 1014 anneals. Step 1016 forms nanocrystals in the rare-earth doped Si having a grain size in the range of 1 to 5 nm in response to the annealing. Note, in some aspects of the invention Step 1010 is performed before Step 1004.

Typically, the method repeats the steps of DC sputtering Si (Step 1004), DC sputtering the rare earth element (Step 1006), and DC sputtering the SiO2 (Step 1010) a plurality of cycles. Thus, Step 1012 forms a lattice structure with the plurality of alternating SiO2 and rare earth element-doped Si layers. For example, Steps 1004, 1006, and 1010 can be repeated between 5 and 60 cycles.

In one aspect, DC sputtering the Si layer in Step 1004 includes depositing a Si layer having a thickness in the range of 1 to 5 nanometers (nm). In another aspect, Step 1004 is performed under the following conditions:

using a Si target including a dopant selected from the group including N and P type dopants;
at a power level in the range between 100 and 300 watts (W);
at a deposition temperature in the range between 20 and 300 degrees C.;
at a deposition pressure in the range between 2 and 10 milliTorr (mT);
in an atmosphere including a gas such as Ar or N2; and
for a deposition time in the range of 0.1 to 5 minutes.

Likewise, DC sputtering the rare earth element in Step 1006 may include DC sputtering under the following conditions:

using a rare earth element target;
at a power level in the range between 50 and 300 W;
at a deposition temperature in the range between 20 and 300 degrees C.;
at a deposition pressure in the range between 2 and 10 mT;
in an atmosphere including a gas such as Ar or N2; and
for a deposition time in the range of 0.1 to 5 minutes.

The rare earth element can be erbium (Er), ytterbium (Yb), cerium (Ce), praseodymium (Pr), or terbium (Tb).

Doping the Si layer with the rare earth element in Step 1008 may include doping the Si layer with a concentration of rare earth element responsive to the rare earth element DC sputtering power level.

In another aspect, DC sputtering the layer of SiO2 overlying the rare earth-doped Si in Step 1010 may include depositing a layer of SiO2 having a thickness in the range of 2 to 3 nm. In one aspect, Step 1010 is performed under the following conditions:

using a Si target including an N or P type dopant;
at a power level in the range between 100 and 300 W;
at a deposition temperature in the range between 20 and 300 degrees C.;
at a deposition pressure in the range between 2 and 10 mT;
in an atmosphere including oxygen, at a percentage in the range between 2 and 30%, with a gas such as Ar or N2; and
for a deposition time in the range of 0.1 to 5 minutes.

In another aspect, annealing in Step 1014 includes using a temperature in the range between 850 and 1250 degrees C., for a time in the range of 10 to 60 minutes, in an atmosphere void of oxygen and including a gas such as Ar or N2.

In a different aspect, providing a substrate in Step 1002 includes providing a substrate bottom electrode. Then, the method comprises another step. Step 1018 forms a top electrode overlying the lattice structure. The top electrode can be a material such as polycrystalline Si, indium tin oxide (ITO), gold (Au), aluminum (Al), zinc oxide (ZnO), or chromium (Cr).

In one variation, providing a substrate in Step 1002 includes providing a substrate made from a temperature-sensitive material such as glass, plastic, or quartz. An additional step, Step 1003A forms a bottom electrode interposed between the substrate and the lattice structure. That is, Step 1003A is performed before either Step 1004 or 1010. Step 1018 forms the top electrode overlying the lattice structure.

In another variation useful for the fabrication of tunneling devices, an initial layer of SiO2 is DC sputtered directly overlying the bottom electrode substrate.

Figure 11:
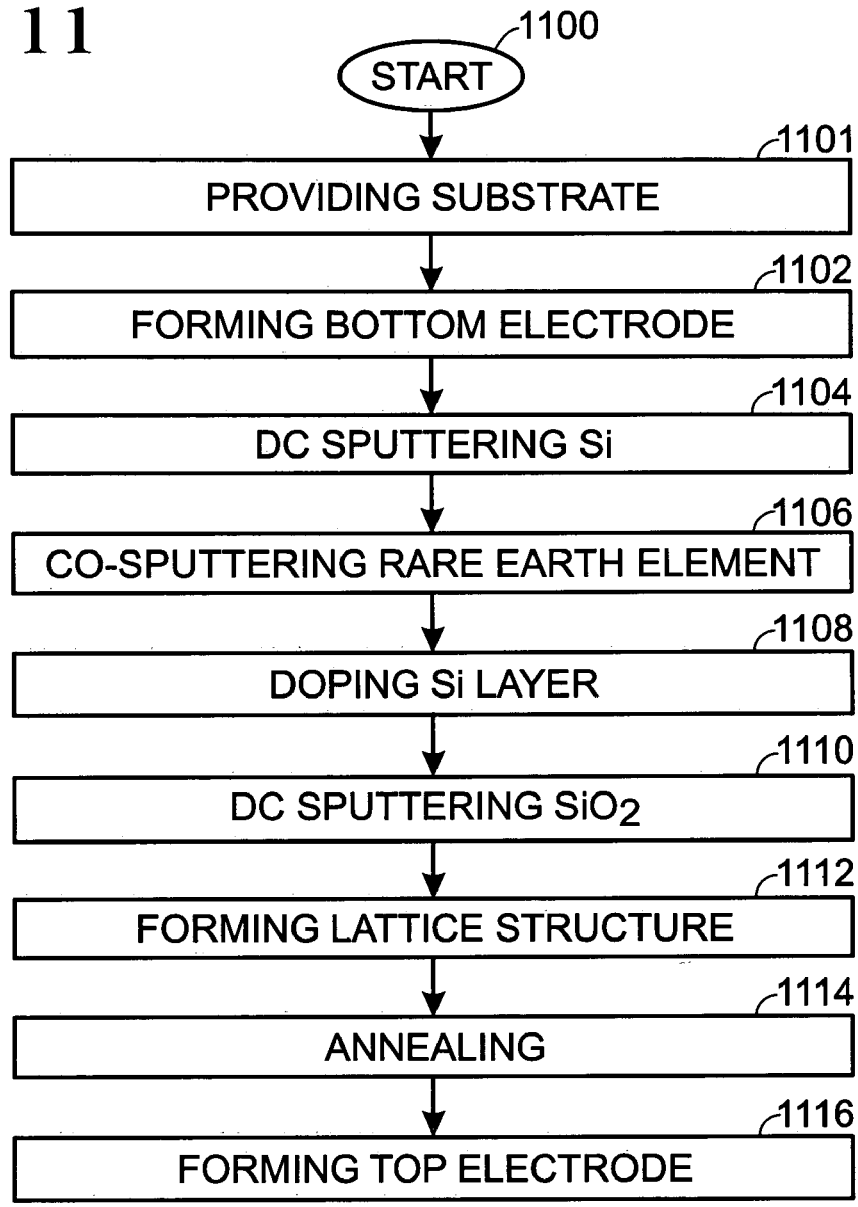
FIG. 11 is a flowchart illustrating a method for forming an electroluminescence (EL) device.

FIG. 11 is a flowchart illustrating a method for forming an electroluminescence (EL) device. The method starts at Step 1100. Step 1102 forms a bottom electrode. Step 1104 DC sputters a layer of amorphous Si overlying the substrate.

Step 1106 co-DC sputters a rare earth element with the Si. Step 1108 dopes the Si layer with the rare earth element in response to the co-DC sputtering. Step 1110 DC sputters a layer of SiO2 overlying the rare earth-doped Si. Step 1112 forms a lattice structure. Step 1114 anneals, and Step 1116 forms a top electrode overlying the lattice structure.

In some aspects, Step 1101 provides a substrate made from a temperature-sensitive material such as glass, plastic, or quartz. Step 1102 forms the bottom electrode overlying the substrate. Details of the process are provided in the explanation of FIG. 10, and will not be repeated here in the interests of brevity.

A lattice structure and EL device are provided made from a rare earth doped-Si layer interfaced with a SiO2 layer. Also provided are fabrication details. Examples of specific process steps and material have been given to clarify the invention. However, the invention is not limited to merely these examples. Other variations and embodiments of the invention will occur to those skilled in the art.

We claim:

1. A method for forming a rare earth element-doped silicon (Si)/Si dioxide (SiO2) lattice structure, the method comprising:
   providing a substrate;
   DC sputtering a layer of amorphous Si overlying the substrate;
   DC sputtering a rare earth element;
   in response to the DC sputtering, doping the amorphous Si layer with the rare earth element;
   DC sputtering a layer of SiO2 overlying the rare earth element-doped Si;
   forming a lattice structure; and
   annealing.

2. The method of claim 1 wherein the rare earth element and amorphous Si are co-DC sputtered.

3. The method of claim 1 further comprising:
   repeating the steps of DC sputtering amorphous Si, DC sputtering the rare earth element, and DC sputtering the SiO2 a plurality of cycles; and
   wherein forming the lattice structure includes forming a lattice structure with the plurality of alternating SiO2 and rare earth element-doped Si layers.

4. The method of claim 1 wherein DC sputtering the amorphous Si layer includes depositing an amorphous Si layer having a thickness in the range of 1 to 5 nanometers (nm).

5. The method of claim 2 wherein DC sputtering the amorphous Si layer includes DC sputtering under the following conditions:
   using a Si target including a dopant selected from the group consisting of N and P type dopants;
   at a power level in the range between 100 and 300 watts (W);
   at a deposition temperature in the range between 20 and 300 degrees C.;
   at a deposition pressure in the range between 2 and 10 milliTorr (mT);
   in an atmosphere including a gas selected from the group including Ar and N2; and
   for a deposition time in the range of 0.1 to 5 minutes.

6. The method of claim 1 further comprising:
   in response to the annealing, forming nanocrystals in the rare-earth element doped Si having a grain size in the range of 1 to 5 nm.

7. The method of claim 3 wherein repeating the steps of DC sputtering amorphous Si, DC sputtering the rare earth element, and DC sputtering the SiO2 the plurality of cycles includes performing a number of cycles in the range between 5 and 60.

8. The method of claim 1 wherein annealing includes using a temperature in the range between 850 and 1250 degrees C., for a time in the range of 10 to 60 minutes, in an atmosphere void of oxygen and including a gas selected from the group consisting of Ar and N2.

9. The method of claim 2 wherein DC sputtering the rare earth element includes DC sputtering under the following conditions:
   using a rare earth element target;
   at a power level in the range between 50 and 300 W;
   at a deposition temperature in the range between 20 and 300 degrees C.;
   at a deposition pressure in the range between 2 and 10 mTorr; in an atmosphere including a gas selected from the group consisting of Ar and N2; and
   for a deposition time in the range of 0.1 to 5 minutes.

10. The method of claim 9 wherein doping the amorphous Si layer with the rare earth element including doping the amorphous Si layer with a concentration of rare earth element responsive to the rare earth element DC sputtering power level.

11. The method of claim 1 wherein DC sputtering the layer of SiO2 overlying the rare earth element-doped Si includes depositing a layer of SiO2 having a thickness in the range of 2 to 3 nm.

12. The method of claim 2 wherein DC sputtering the layer of SiO2 overlying the rare earth element-doped Si includes DC sputtering under the following conditions:
   using a Si target including a dopant selected from the group consisting of N and P type dopants;
   at a power level in the range between 100 and 300 W;
   at a deposition temperature in the range between 20 and 300 degrees C.;
   at a deposition pressure in the range between 2 and 10 mTorr;
   in an atmosphere including oxygen, at a percentage in the range between 2 and 30%, and a gas selected from the group consisting of Ar and N2; and
   for a deposition time in the range of 0.1 to 5 minutes.

13. The method of claim 1 wherein DC sputtering the rare earth element includes DC sputtering a rare earth element selected from the group consisting of erbium (Er), ytterbium (Yb), cerium (Ce), praseodymium (Pr), terbium (Tb).

14. The method of claim 1 wherein providing a substrate includes providing a bottom electrode substrate;
   the method further comprising:
   forming a top electrode overlying the lattice structure.

15. The method of claim 14 further comprising:
   DC sputtering an initial layer of SiO2 directly overlying the bottom electrode substrate.

16. The method of claim 14 wherein forming a top electrode includes forming a top electrode from a material selected from the group consisting of polycrystalline Si, indium tin oxide (ITO), gold (Au), aluminum (Al), zinc oxide (ZnO), and chromium (Cr).

17. The method of claim 1 wherein providing a substrate includes providing a substrate material selected from the group consisting of Si, N type Si, P type Si, Si glass, gallium arsenic (GaAs), silicon carbide (SiC), gallium nitride (GaN), and Al2O3 (sapphire).

18. The method of claim 1 wherein providing a substrate includes providing a substrate made from a temperature-sensitive material selected from the group consisting of glass, plastic, and quartz;

the method further comprising:
- forming a bottom electrode interposed between the substrate and the lattice structure; and
- forming a top electrode overlying the lattice structure.

19. A method for forming an electroluminescence (EL) device, the method comprising: forming a bottom electrode on a substrate;
- DC sputtering a layer of amorphous Si overlying the substrate;
- co-DC sputtering a rare earth element with the amorphous Si;
- in response to the co-DC sputtering, doping the amorphous Si layer with the rare earth element;
- DC sputtering a layer of SiO2 overlying the rare earth element-doped Si;
- forming a lattice structure;
- annealing; and
- forming a top electrode overlying the lattice structure.

20. The method of claim 19 further comprising:
- providing a substrate made from a temperature-sensitive material selected from the group consisting of glass, plastic, and quartz; and
- wherein forming the bottom electrode includes forming the bottom electrode overlying the substrate.

21. A rare earth element-doped silicon (Si)/Si dioxide (SiO2) lattice structure, the structure comprising:
- a substrate;
- a lattice structure overlying the substrate including:
  - a rare earth element-doped Si layer; and
  - a SiO2 layer; and,
- wherein the lattice structure includes a number of alternating layer sets in the range between 5 and 60, where each set includes a rare earth element-doped Si layer and a SiO2 layer.

22. The structure of claim 21 wherein the rare earth element-doped Si layer has a thickness in the range of 1 to 5 nanometers (nm).

23. The structure of claim 21 wherein the rare earth element-doped Si layer includes Si nanocrystals having a grain size in the range of 1 to 5 nm.

24. The structure of claim 21 wherein the SiO2 layer has a thickness in the range of 2 to 3 nm.

25. The structure of claim 21 wherein the rare earth element-doped Si layer includes a rare earth element selected from the group consisting of erbium (Er), ytterbium (Yb), cerium (Ce), praseodymium (Pr), terbium (Tb).

26. The structure of claim 21 wherein the substrate is a bottom electrode substrate; and
- the structure further comprising:
  - a top electrode overlying the lattice structure.

27. The structure of claim 26 further comprising;
- an initial layer of SiO2 directly overlying the bottom electrode substrate.

28. The structure of claim 26 wherein the top electrode is a material selected from the group consisting of polycrystalline Si, indium tin oxide (ITO), gold (Au), aluminum (Al), zinc oxide (ZnO), and chromium (Cr).

29. The structure of claim 21 wherein the substrate is a material selected from the group consisting of Si, N type Si, P type Si, Si glass, gallium arsenic (GaAs), silicon carbide (SiC), gallium nitride (GaN), and Al2O3 (sapphire).

30. The structure of claim 21 wherein the substrate is a temperature-sensitive material selected from the group consisting of glass, plastic, and quartz; and
- the structure further comprising:
  - a bottom electrode interposed between the substrate and the lattice structure; and
  - a top electrode overlying the lattice structure.

31. An electroluminescence device comprising:
- a bottom electrode;
- a lattice structure overlying the bottom electrode with a plurality of alternating layers including:
  - a rare earth element-doped Si layer; and
  - a SiO2 layer; and
- a top electrode overlying the lattice structure.

32. The device of claim 31 further comprising:
- a substrate made from a temperature-sensitive material selected from the group consisting of glass, plastic, and quartz; and
- wherein the bottom electrode is interposed between the substrate and the lattice structure.

33. A rare earth element-doped silicon (Si)/Si dioxide (SiO2) lattice structure, the structure comprising:
- a bottom electrode substrate;
- a lattice structure overlying the substrate including:
  - a rare earth element-doped Si layer;
  - a SiO2 layer; and
- a top electrode overlying the lattice structure.

* * * * *